United States Patent
Yu et al.

(10) Patent No.: US 8,912,651 B2
(45) Date of Patent: Dec. 16, 2014

(54) PACKAGE-ON-PACKAGE (POP) STRUCTURE INCLUDING STUD BULBS AND METHOD

(75) Inventors: Chen-Hua Yu, Hsin-Chu (TW);
Mirng-Ji Lii, Sinpu Township (TW);
Chung-Shi Liu, Hsin-Chu (TW);
Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/397,747

(22) Filed: Feb. 16, 2012

(65) Prior Publication Data
US 2013/0134588 A1 May 30, 2013

Related U.S. Application Data

(60) Provisional application No. 61/565,280, filed on Nov. 30, 2011.

(51) Int. Cl.
*H01L 23/498* (2006.01)

(52) U.S. Cl.
USPC ........... 257/738; 257/E23.069; 257/737; 257/778; 257/779; 257/780; 257/782; 257/784

(58) Field of Classification Search
USPC ......... 257/737, 734, 738, 778, 779, 780, 782, 257/784, 786, 686, 685, 723, E23.069
See application file for complete search history.

(56) References Cited

U.S. PATENT DOCUMENTS

| | | | |
|---|---|---|---|
| 5,889,326 A * | 3/1999 | Tanaka | 257/737 |
| 7,372,151 B1 * | 5/2008 | Fan et al. | 257/738 |
| 7,405,478 B2 * | 7/2008 | Ishikawa et al. | 257/737 |
| 8,519,428 B2 * | 8/2013 | Hsu et al. | 257/99 |
| 8,525,318 B1 * | 9/2013 | Kim et al. | 257/686 |
| 2002/0056906 A1 * | 5/2002 | Kajiwara et al. | 257/697 |
| 2003/0001286 A1 * | 1/2003 | Kajiwara et al. | 257/778 |
| 2003/0022477 A1 * | 1/2003 | Hsieh et al. | 438/612 |
| 2003/0151140 A1 * | 8/2003 | Nishiyama et al. | 257/737 |
| 2004/0084206 A1 * | 5/2004 | Tung | 174/255 |
| 2006/0055032 A1 * | 3/2006 | Chang et al. | 257/734 |
| 2006/0065978 A1 * | 3/2006 | Nishiyama et al. | 257/737 |

(Continued)

FOREIGN PATENT DOCUMENTS

| | | |
|---|---|---|
| JP | 2007165443 A | 6/2007 |
| KR | 20110126559 A | 11/2011 |

OTHER PUBLICATIONS

Riley, G. A., "Stud Bump Flip Chip," Flipchips: Tutorials 3, Stud Bump Flip Chip, Dec. 2000, 4 pages, FlipChips Dot Com, Worcester, MA.

(Continued)

*Primary Examiner* — Alexander Oscar Williams
(74) *Attorney, Agent, or Firm* — Slater & Matsil, L.L.P.

(57) ABSTRACT

Embodiments concern Package-On-Package (PoP) structures including stud bulbs and methods of forming PoP structures. According to an embodiment, a structure includes a first substrate, stud bulbs, a die, a second substrate, and electrical connectors. The stud bulbs are coupled to a first surface of the first substrate. The die is attached to the first surface of the first substrate. The electrical connectors are coupled to the second substrate, and respective ones of the electrical connectors are coupled to respective ones of the stud bulbs.

16 Claims, 12 Drawing Sheets

(56) References Cited

U.S. PATENT DOCUMENTS

| | | |
|---|---|---|
| 2008/0197173 A1* | 8/2008 | Kitae et al. ............ 228/180.22 |
| 2008/0217768 A1* | 9/2008 | Miranda et al. ............ 257/737 |
| 2008/0258289 A1* | 10/2008 | Pendse et al. ............ 257/690 |
| 2009/0014852 A1* | 1/2009 | Lee ............ 257/676 |
| 2009/0057866 A1* | 3/2009 | Chow ............ 257/690 |
| 2009/0096095 A1* | 4/2009 | Ishido ............ 257/737 |
| 2009/0127706 A1* | 5/2009 | Shen et al. ............ 257/737 |
| 2009/0246474 A1* | 10/2009 | Sakurai et al. ............ 428/172 |
| 2010/0117229 A1* | 5/2010 | Datta et al. ............ 257/738 |
| 2010/0171205 A1* | 7/2010 | Chen et al. ............ 257/686 |
| 2011/0278712 A1 | 11/2011 | Hu et al. |
| 2013/0009319 A1* | 1/2013 | Shao et al. ............ 257/774 |
| 2013/0093087 A1* | 4/2013 | Chau et al. ............ 257/738 |
| 2013/0099385 A1* | 4/2013 | Chen et al. ............ 257/773 |
| 2013/0105979 A1* | 5/2013 | Yu et al. ............ 257/762 |
| 2013/0143361 A1* | 6/2013 | Lin et al. ............ 438/110 |
| 2013/0168438 A1* | 7/2013 | Lamprecht et al. ............ 228/165 |
| 2013/0168856 A1* | 7/2013 | Wang et al. ............ 257/738 |
| 2013/0221452 A1* | 8/2013 | Strothmann et al. ............ 257/414 |
| 2013/0234317 A1* | 9/2013 | Chen et al. ............ 257/737 |
| 2013/0241080 A1* | 9/2013 | Pagaila ............ 257/774 |
| 2013/0249106 A1* | 9/2013 | Lin et al. ............ 257/774 |
| 2013/0270682 A1* | 10/2013 | Hu et al. ............ 257/666 |
| 2014/0001612 A1* | 1/2014 | Yu et al. ............ 257/668 |
| 2014/0021605 A1* | 1/2014 | Yu et al. ............ 257/738 |

OTHER PUBLICATIONS

Korean Office Action and English Translation, Patent Application No. 10-2012-0067949, Aug. 19, 2013, 9 pages.

* cited by examiner

PACKAGE-ON-PACKAGE (POP) STRUCTURE INCLUDING STUD BULBS AND METHOD

This application claims the benefit of U.S. Provisional Patent Application Ser. No. 61/565,280, filed on Nov. 30, 2011, entitled "Package-On-Package (PoP) Structure and Method," which application is hereby incorporated herein by reference in its entirety.

BACKGROUND

Electronics can be divided into a simple hierarchy consisting of devices such as integrated circuit (IC) chips, packages, printed circuit boards (PCB), and a system. The package is the interface between an electronic device, such as a computer chip, and a PCB. Devices are made from semiconductor materials such as silicon. Integrated circuits are assembled into a package such as a quad flat pack (QFP), pin grid array (PGA), or ball grid array (BGA), using wire bonding (WB), tape automated bonding (TAB), or flip chip (FC) bumping assembly techniques. The packaged device is then attached either directly to a printed wiring board or to another type of substrate, which is defined as the second level of packaging.

Ball grid array (BGA) packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory such as Dynamic Random Access Memory and others.

A basic flip-chip (FC) packaging technology comprises an IC, an interconnect system, and a substrate. A function chip is connected to the substrate with a plurality of solder bumps, wherein the solder bumps forming a metallurgical interconnection between the chip and the substrate. The function chip, the solder bump, and the substrate form a flip-chip package. Further, a plurality of balls form a ball grid array (BGA).

Wire bonding can be used to make the electrical connections from chip components such as chip resistors or chip capacitors to substrate. Two function chips are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package.

Package-on-Package (PoP) is an integrated circuit packaging technique to allow vertically combining, for example, discrete logic and memory ball grid array (BGA) packages. Two or more packages are installed on top of one another, e.g. stacked, with a standard interface to route signals between them. This allows higher density, for example in the mobile telephone/PDA market.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a package-on-package (PoP) structure. Other embodiments may also be applied, however, to other packages or structures, such as three dimensional integrated circuits (3DIC).

It should be noted that although method embodiments explicitly discussed herein are discussed with respect to a particular order, embodiments contemplate methods with steps performed in any logical order. Further, throughout the various views and illustrative embodiments, like reference numbers are used to designate like elements.

Figure 1:
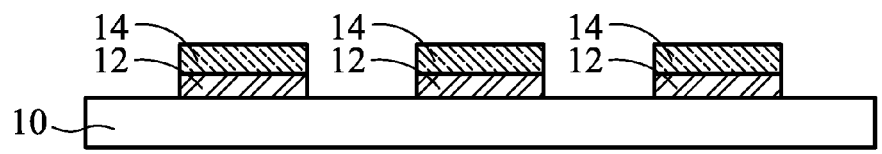
FIGS. 1 through 8 are a first method of forming a package-on-package (PoP) structure according to an embodiment.

FIGS. 1 through 8 illustrate a first method of forming a PoP structure according to an embodiment. In FIG. 1, a first substrate 10, for example, a bottom substrate, is provided with pads 12 over a top surface of the first substrate 10. An organic solderability preservative (OSP) 14 is provided over a top surface of each of the pads 12. The first substrate 10 may be, for example, an organic substrate, a semiconductor wafer, glass, a silicon interposer, an organic interposer, the like, or a combination thereof. The first substrate 10 may comprise, for example, unsingulated or singulated dies and/or interposers. Each die and/or interposer can comprise active and/or passive devices and/or through vias. The first substrate 10 may also comprise various layers of materials, such as dielectric layers, passivation layers, and/or metallization layers.

The pads 12, in an embodiment, are formed directly connected to respective patterns in a top metallization through a passivation layer. In another embodiment, the pads 12 are each a pattern in a top metallization layer. In further embodiments, the pads 12 can be respective exposed portions of through vias and/or can be formed on respective portions of through vias. The pads 12, in an embodiment, are a metal, a metal alloy, or layers of a metal(s) and/or metal alloy. In this embodiment, the pads 12 are copper, and in other embodiments, the pads 12 may comprise copper, gold, aluminum, aluminum copper (Al(Cu)), nickel, the like, or a combination thereof. The pads 12 provide an exterior electrical connection to various devices and/or components within and/or coupled to the first substrate 10.

Figure 2:
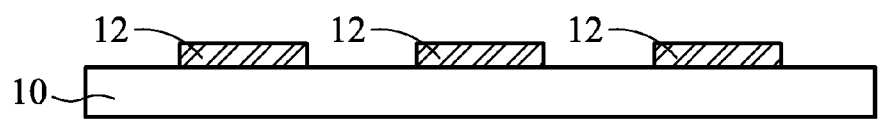

In FIG. 2, the OSP 14 is removed from each of the pads 12 to expose the top surfaces of the pads 12. The OSP 14 may be removed by an acceptable removal process, such as by dispersing a flux on the substrate, a chemical solution (acid or alkali), the like, or a combination thereof.

Figure 3:
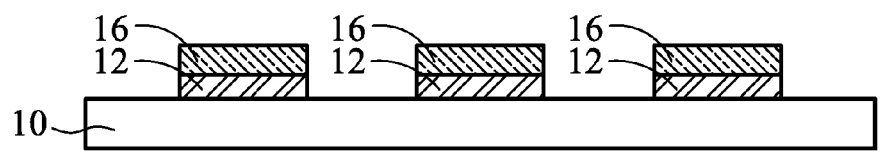

In FIG. 3, a pad protection layer 16 is formed over the top surface of each of the pads 12. The pad protection layers 16, in some embodiments, are a metal, a metal alloy, layers of a metal(s) or metal alloy(s), the like, or a combination thereof. Examples of metals include tin, nickel, palladium, gold, the like, or a combination thereof. The pad protection layers 16 may be formed, for example, by immersion plating, electro-plating, electroless-plating, the like, or a combination thereof. In an embodiment, the pad protection layers 16 are tin formed by immersion plating. In another embodiment, the pad protection layers 16 are electroless nickel, electroless palladium, immersion gold (ENEPIG). In other embodiments, the pad protection layers 16 are each a self-assembled monolayer and can comprise Alkane with a number of carbon atoms between 4 and 30 and with a functional group like a thiol group or an alcohol group formed by immersion, spin coating, printing, the like, or a combination thereof.

Figure 4:
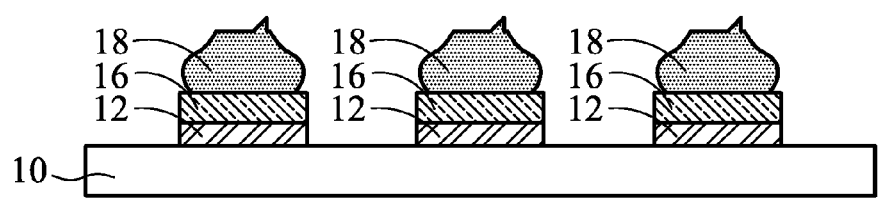

In FIG. 4, stud bulbs 18 are formed on respective pad protection layers 16. The stud bulbs 18 are formed, for example, by melting tips of wires to form a sphere at each tip of the wires. The spheres are then placed on the pad protection layers 16, and a mechanical force, heat, and/or ultrasonic energy is applied to bond the spheres to the pad protection layers 16. The wires are then broken above the spheres (or what was previously the spheres since the force, heat, and/or ultrasonic energy may have changed the shape). The wires used in this step can be copper, gold, aluminum, silver, an alloy, the like, or a combination thereof. The wires can also have doping elements in the metal. Further, the wires can be a first metal coated with a second metal, for example, a copper wire coated with palladium. The wires can have a diameter between approximately 0.3 mils and approximately 5 mils, such as approximately 1.5 mils. The stud bulbs 18 can therefore comprise the same material as the wires.

Figure 5:
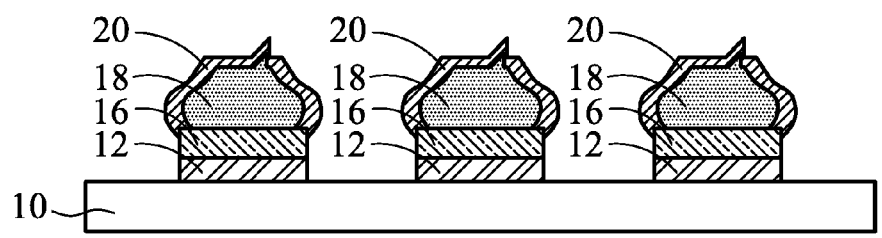

In FIG. 5, bulb protection coatings 20 are formed on respective stud bulbs 18. The bulb protection coatings 20, in some embodiments, are a metal, a metal alloy, layers of a metal(s) or metal alloy(s), the like, or a combination thereof. Examples of metals include tin, nickel, palladium, gold, silver, the like, or a combination thereof. The bulb protection coatings 20 may be formed, for example, by immersion plating, electro-plating, electroless-plating, the like, or a combination thereof. In an embodiment, the bulb protection coatings 20 are tin formed by immersion plating. In another embodiment, the bulb protection coatings 20 are ENEPIG. In other embodiments, the bulb protection coatings 20 are each a self-assembled monolayer, such as Alkane with a number of carbon atoms between 4 and 30 and with a functional group like a thiol group or an alcohol group formed by immersion, spin coating, printing, the like, or a combination thereof. In further embodiments, the bulb protection coatings 20 are each an OSP formed by acceptable techniques. The bulb protection coatings 20 may provide a layer on the stud bulbs 18 to prevent the stud bulbs 18 from oxidizing, for example, from having a copper oxide formed on the stud bulbs 18 when the stud bulbs are copper.

Figure 6:
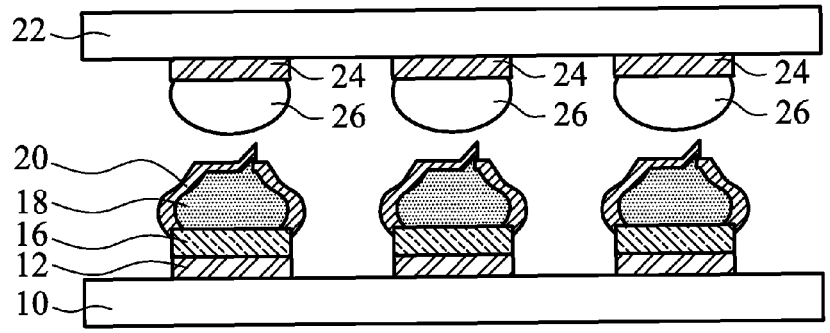

In FIG. 6, a second substrate 22, for example, a top substrate, is provided. The second substrate 22 may have any of the features and/or components previously discussed with respect to the first substrate 10. The second substrate 22 has pads 24 on a bottom surface of the second substrate 22. The pads 24, in an embodiment, are formed directly connected to respective patterns in a metallization through a passivation layer. In another embodiment, the pads 24 are each a pattern in a metallization layer. In further embodiments, the pads 24 can be respective exposed portions of through vias and/or can be formed on respective portions of through vias. The pads 24, in an embodiment, are a metal, a metal alloy, or layers of a metal(s) and/or metal alloy. In this embodiment, the pads 24 are copper, and in other embodiments, the pads 24 may comprise copper, gold, aluminum, aluminum copper (Al(Cu)), the like, or a combination thereof. The pads 24 provide an exterior electrical connection to various devices and/or components within and/or coupled to the second substrate 22. A solder 26 is provided on the pads 24. The solder 26 can be any solder material, such as lead free solder or the like, formed by acceptable methods.

Figure 7:
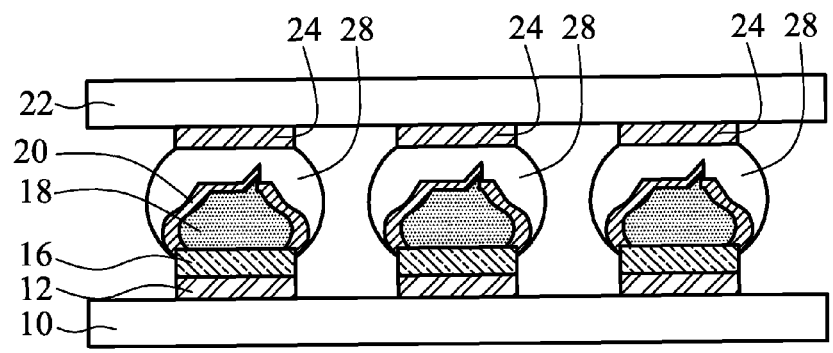
Figure 8:
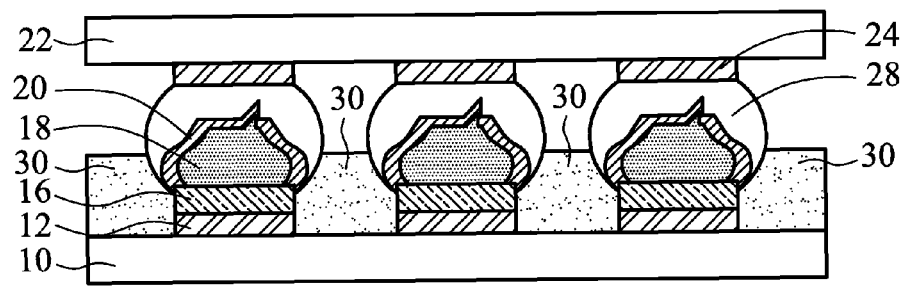

In FIG. 7, the solder 26 on the second substrate 22 is brought into contact with the stud bulbs 18 on the first substrate 10 and is reflowed to form reflowed solder connectors 28. The reflowed solder connectors 28 provide mechanical and electrical connections between the stud bulbs 18 on the first substrate 10 and the pads 24 on the second substrate 22. In FIG. 8, a molding compound 30 is dispensed in the space between the first substrate 10 and the second substrate 22 and around the connections made between the substrates 10 and 22. The molding compound 30 may be an acceptable material, such as an epoxy or the like. In other embodiments, an underfill material, a non-conductive paste (NCP), a non-conductive film (NCF), or other dielectric film can be used in the place of the molding compound 30.

It is worth noting that embodiments such as the structure shown in FIG. 8 contemplate various additional features that are not explicitly shown in the figures. For example, the substrates 10 and 22 can each have additional electrical connectors on additional surfaces. The bottom surface of first substrate 10 and the top surface of the second substrate 22 can have stud bulbs, microbumps, minibumps, pillars, columns, BGA balls, controlled collapse chip connection (C4) bumps, the like, or a combination thereof. Additionally, dies can be on various surfaces of the substrates 10 and 22. For example, a die(s) can be attached by electrical connectors to the bottom and/or to the top surfaces of each of the substrates 10 and 22. Any number of dies can be on any surface. Further features of embodiments will be readily apparent to a person having ordinary skill in the art.

Figure 9:
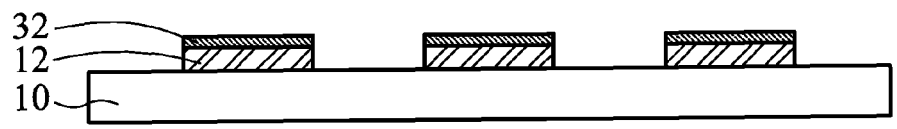
FIGS. 9 through 14 are a second method of forming a PoP structure according to an embodiment.

FIGS. 9 through 14 illustrate a second method of forming a PoP structure according to an embodiment. According to this embodiment, the first substrate 10 and pads 12 are processed according to the steps discussed with respect to FIGS. 1 and 2. In FIG. 9, the top surfaces of the pads 12 are treated to form treated surfaces 32. The treatment can be a process to enhance the bonding of later formed stud bulbs with the pads 12. In an embodiment, the treatment includes using an ammonia ($NH_3$), argon (Ar), oxygen ($O_2$), ozone ($O_3$), hydrogen ($H_2$), nitrogen ($N_2$), or methane ($CH_4$) plasma. In another embodiment, the treatment includes doping the pads 12 with germanium (Ge). Other plasma treatments or dopants can be used, as a person having ordinary skill in the art will readily understand.

Figure 10:
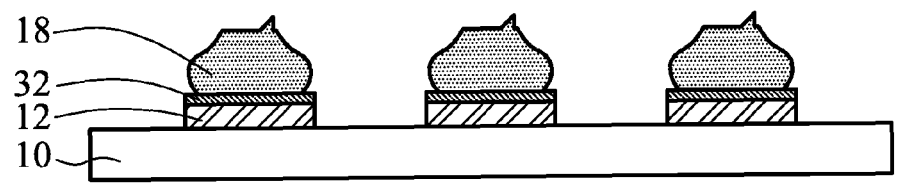
Figure 11:
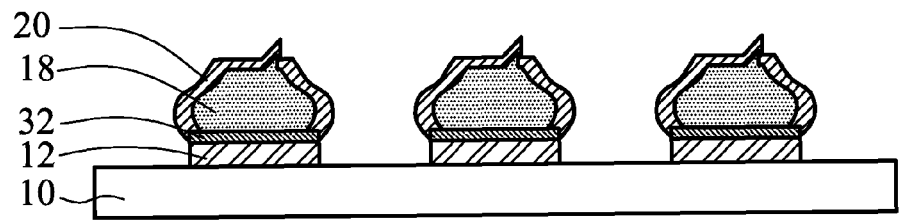
Figure 12:
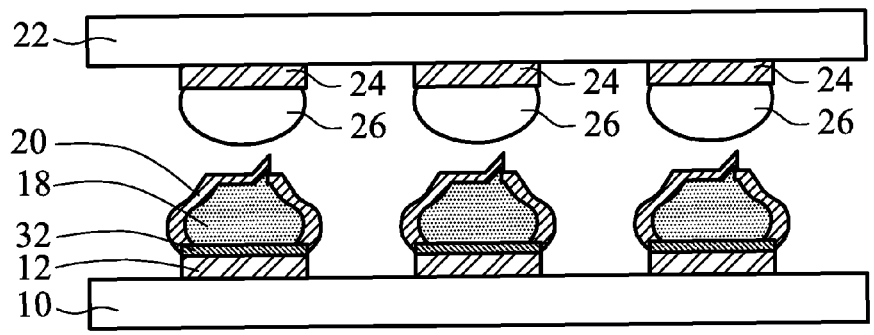
Figure 13:
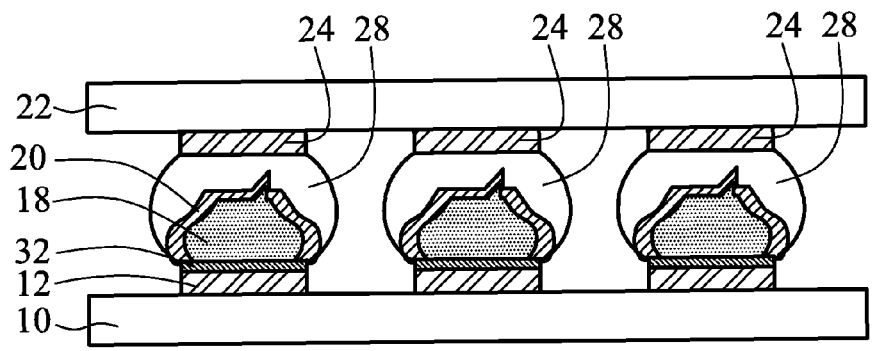
Figure 14:
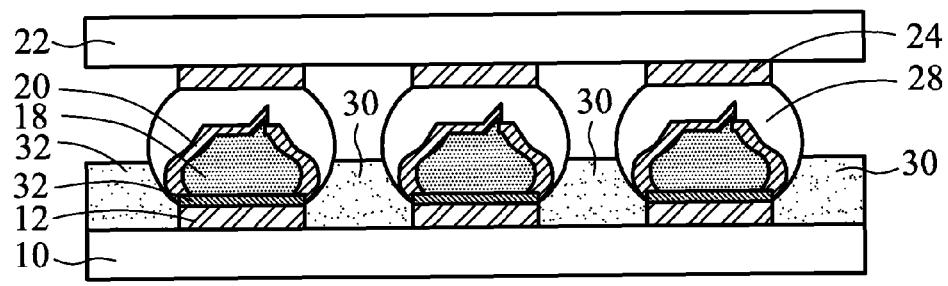

In FIG. 10, stud bulbs 18 are formed on the treated surfaces 32 in the same or similar manner as previously discussed with regard to FIG. 4. In FIG. 11, bulb protection coatings 20 are formed on respective stud bulbs 18 in the same or similar manner as previously discussed with regard to FIG. 5. FIGS. 12 through 14 illustrate providing the second substrate 22, attaching the first substrate 10 to the second substrate 22 by reflowing, and providing a molding compound 30 between the substrates 10 and 22 in the same or similar manner as previously discussed with regard to FIGS. 6 through 8. As with the previous embodiment, the structure of FIG. 14 may have features that are not explicitly shown.

Figure 15:
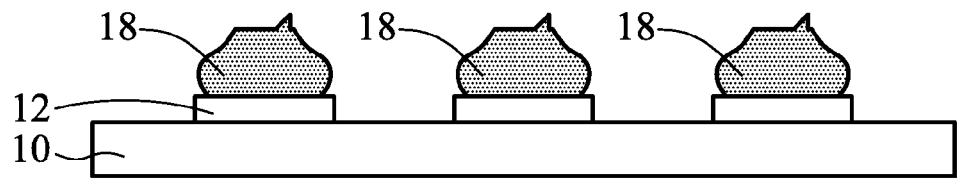
FIGS. 15 through 19 are a third method of forming a PoP structure according to an embodiment.
Figure 16:
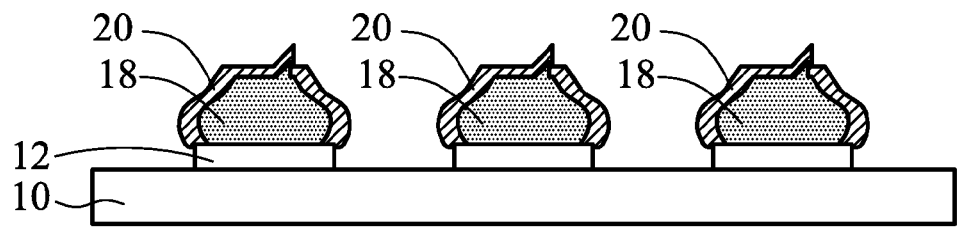
Figure 17:
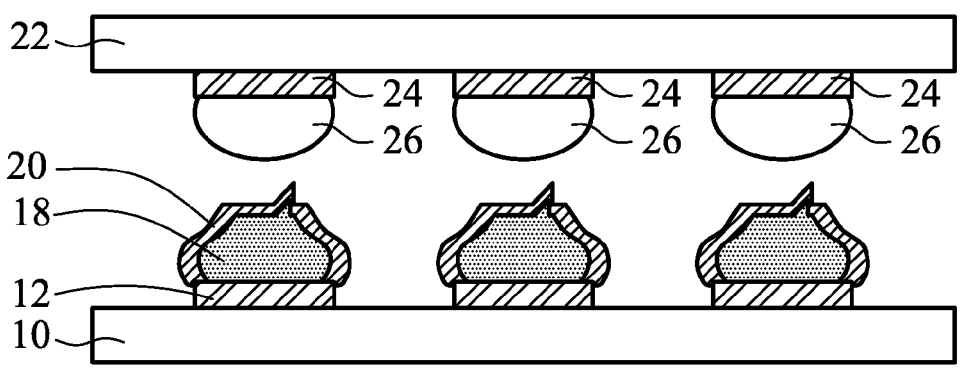
Figure 18:
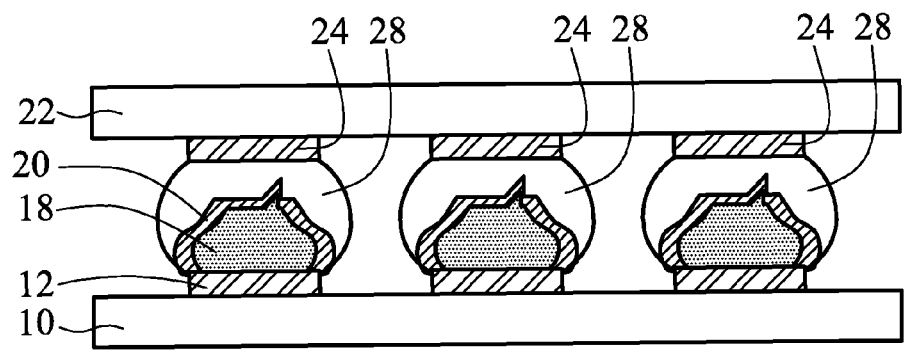
Figure 19:
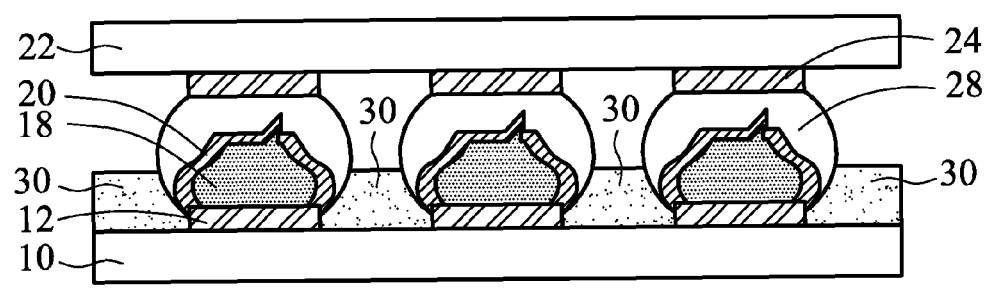

FIGS. 15 through 19 illustrate a third method of forming a PoP structure according to an embodiment. According to this embodiment, the first substrate 10 and pads 12 are processed according to the steps discussed with respect to FIGS. 1 and 2. In FIG. 15, stud bulbs 18 are formed directly on the pads 12 in the same or similar manner as previously discussed with regard to FIG. 4. In this embodiment, the stud bulbs 18 may be bonded by a direct metal-metal bond to the pads 12. The stud bulbs 18 may be a same material as the pads 12, such as copper, aluminum, aluminum copper (Al(Cu)), the like, or a combination thereof. In another embodiment, the stud bulbs 18 may comprise a different material than the pads 12, for example, the stud bulbs 18 can comprise copper while the pads 12 comprise aluminum or aluminum copper. FIGS. 16 through 19 illustrate forming the bulb protection coatings 20 on respective stud bulbs 18, providing the second substrate 22, attaching the first substrate 10 to the second substrate 22 by reflowing, and providing a molding compound 30 between the substrates 10 and 22 in the same or similar manner as previously discussed with regard to FIGS. 5 through 8. As with the previous embodiments, the structure of FIG. 19 may have features that are not explicitly shown.

Figure 20:
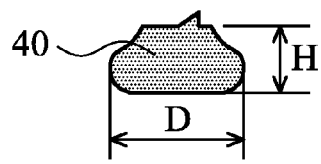
FIG. 20 is a single stud bulb according to an embodiment.

FIGS. 20 through 24 illustrate various features of stud bulbs according to embodiments. Any of these features can be incorporated or used in the foregoing embodiments. FIG. 20 illustrates a single stud bulb 40, such as the stud bulb 18 illustrated in the foregoing figures. The single stud bulb 40 is formed, for example, by melting a tip of a wire to form a sphere at the tip. The sphere is then placed on a bonding surface, and a mechanical force, heat, and/or ultrasonic energy is applied to bond the sphere to the bonding surface. The wire is then broken above the sphere (or what was previously the sphere since the force, heat, and/or ultrasonic energy may have changed the shape). The single stud bulb 40 has a diameter D between approximately 0.3 mils and approximately 5 mils, such as approximately 1.5 mils, and the single stud bulb 40 has a height H between approximately 20 micrometers and approximately 200 micrometers, such as approximately 150 micrometers.

Figure 21:
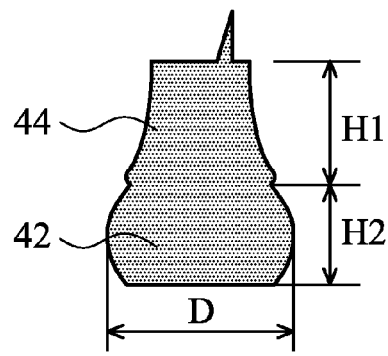
FIG. 21 is a single stud bulb with an elongated tail according to an embodiment.

FIG. 21 illustrates a single stud bulb 42 with an elongated tail 44. The single stud bulb 42 with elongated tail 44 is formed, for example, in a similar manner as the single stud bulb 40 in FIG. 20, except that the wire is broken at some distance from the single stud bulb 42 such that the elongated tail 44 remains. In other embodiments, other process parameters can be modified to form the elongated tail 44. The elongated tail 44 has a height H1 between approximately 10 micrometers and approximately 200 micrometers, such as approximately 100 micrometers, and the single stud bulb 42 has a height H2 between approximately 5 micrometers and approximately 80 micrometers, such as approximately 50 micrometers.

Figure 22:
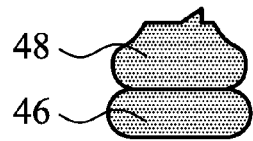
FIG. 22 is stacked single stud bulbs comprising a same material according to an embodiment
Figure 23:
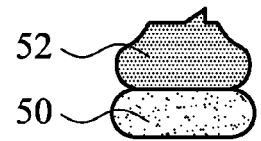
FIG. 23 is stacked single stud bulbs comprising different materials according to an embodiment.

FIGS. 22 and 23 each show stacked single stud bulbs. In FIG. 22, the single stud bulbs 46 and 48 can be formed sequentially in the same or similar manner as the single stud bulb 40 in FIG. 20. The single stud bulbs 46 and 48 in this embodiment are a same material. For example, each of the single stud bulbs 46 and 48 is copper. In FIG. 23, the single stud bulbs 50 and 52 can be formed sequentially in the same or similar manner as the single stud bulb 40 in FIG. 20. The single stud bulbs 50 and 52 in this embodiment comprise different materials. For example, the single stud bulb 50 is gold, and the single stud bulb 52 is copper. Although only two single stud bulbs are illustrated in FIGS. 22 and 23, other embodiments contemplate more single stud bulbs that are stacked and/or comprising various combinations of materials.

Figure 24:
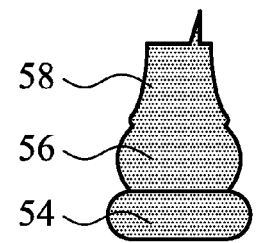
FIG. 24 is stacked single stud bulbs, one of which having an elongated tail, according to an embodiment.

FIG. 24 illustrates stacked single stud bulbs, one of which having an elongated tail. Single stud bulb 56 with elongated tail 58 is formed stacked on single stud bulb 54. The single stud bulb 54 is formed, for example, in the same or similar manner as the single stud bulb of FIG. 20, and the single stud bulb 56 with elongated tail 58 is formed, for example, in the same or similar manner as the single stud bulb 42 with elongated tail 44 of FIG. 21. The stud bulbs 54 and 56 and elongated tail 58 may include the same material(s) or different materials, such as discussed with respect to FIGS. 22 and 23, and further, may have additional single stud bulbs stacked.

Figure 25:
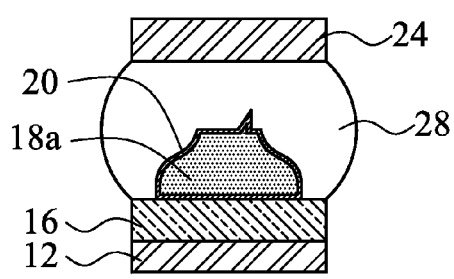
FIG. 25 is a joint with a single stud bulb and a reflowed solder connector wetted to a pad protection layer according to an embodiment.
Figure 26:
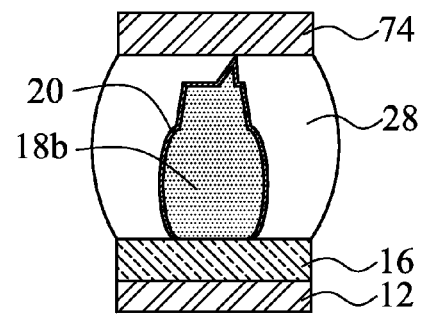
FIG. 26 is a joint with a single stud bulb with a greater height and/or elongated tail and a reflowed solder connector wetted to a pad protection layer according to an embodiment.

FIGS. 25 through 28 illustrate various aspects of embodiments. FIGS. 25 and 26 show an example pad 12, pad protection layer 16, stud bulb 18, bulb protection coating 20, reflowed solder connector 28, and pad 24, such as shown in FIG. 8. FIG. 25 shows a single stud bulb 18a as the stud bulb 18, and FIG. 26 shows a single stud bulb 18b with a greater height and/or an elongated tail as the stud bulb 18. In FIGS. 25 and 26, the pad protection layer 16 is an ENEPIG structure, for example. The reflowed solder connector 28 is wetted to the top surface of the pad protection layer 16 such that the entirety of the top surface of the pad protection layer 16 outside of the stud bulb 18 is contacted by the reflowed solder connector 28. It should be noted that the entirety of the top surface is understood to include substantially the entirety of the top surface, such as would result in accordance with appropriate processes, like those disclosed herein, as a person having ordinary skill in the art would understand the term.

Although not expressly illustrated, the reflowed solder connector 28 can be wetted to the top surface of the treated surface 32 (FIG. 14) and/or the pad 12 (FIG. 19) when those respective surfaces are used as the bonding surface of the stud bulb 18, similar to what is shown in FIGS. 25 and 26. In other embodiments, the reflowed solder connector 28 may not be wetted to the top surface of the treated surface 32 and/or the pad 12.

Figure 27:
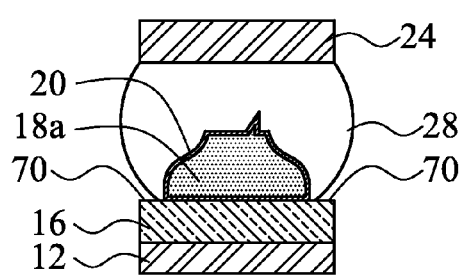
FIG. 27 is a joint with a single stud bulb and a reflowed solder connector that is not wetted to a pad protection layer according to an embodiment.
Figure 28:
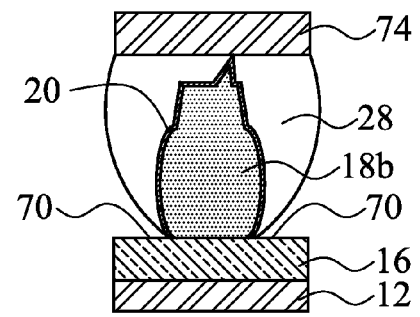
FIG. 28 is a joint with a single stud bulb with a greater height and/or elongated tail and a reflowed solder connector that is not wetted to a pad protection layer according to an embodiment.

FIGS. 27 and 28 show an example pad 12, pad protection layer 16, stud bulb 18, bulb protection coating 20, reflowed solder connector 28, and pad 24, such as shown in FIG. 8. FIG. 27 shows a single stud bulb 18a as the stud bulb 18, and FIG. 28 shows a single stud bulb 18b with a greater height and/or an elongated tail as the stud bulb 18. In FIGS. 27 and 28, the pad protection layer 16 is an immersion tin, self-assembled monolayer, or OSP structure, for example. The reflowed solder connector 28 is not wetted to the top surface of the pad protection layer 16, and portions 70, such as along the periphery, of the pad protection layer 16 are not contacted by the reflowed solder connector 28 and are exposed.

Figure 29:
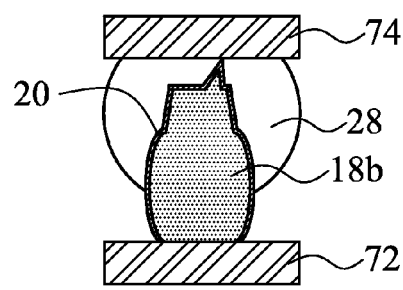
FIG. 29 is a partial joint according to an embodiment.

FIG. 29 illustrates a partial joint. A partial joint is formed, for example, when an amount of solder 26 is not sufficient to form completely over the stud bulb 18 when reflowed. FIG. 29 shows a stud bulb 18b with a great height and/or elongated tail bonded to a bonding surface 72. A bulb protection coating 20 is on the stud bulb 18b. Reflowed solder connector 28 is reflowed around the stud bulb 18b and connected to bonding surface 74. The bonding surface 72 can be the pad protection layer 16, treated surface 32, or the pad 12, and the bonding surface 74 can be the pad 24, for example. The reflowed solder connector 28 does not completely cover the stud bulb 18b, and a portion of the bulb protection coating 20 is exposed. It should be noted that various configurations of the stud bulb can be used, such as a single stud bulb, stacked single stud bulbs, a single stud bulb with a great height, a single stud bulb with an elongated tail, or a combination thereof.

Figure 30:
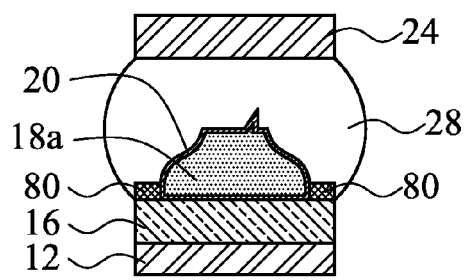
FIG. 30 is a joint with a single stud bulb and an intermetallic compound (IMC) on a pad protection layer according to an embodiment.

FIGS. 30 through 33 illustrate various modifications to a stud bulb according to embodiments. FIG. 30 depicts the structure of FIG. 25, for example, except including an intermetal compound (IMC) 80. The IMC 80 is formed on portions of the pad protection layer 16 that the reflowed solder contacts during the reflow process. The IMC 80 can be formed by including a material in the solder 26 that reacts with the pad protection layer 16 during the reflow process. The IMC 80 can be a copper tin (for example, $Cu_3Sn$ or $Cu_6Sn_5$), nickel tin (for example, $Ni_3Sn_4$), the like, or a combination thereof.

Figure 31:
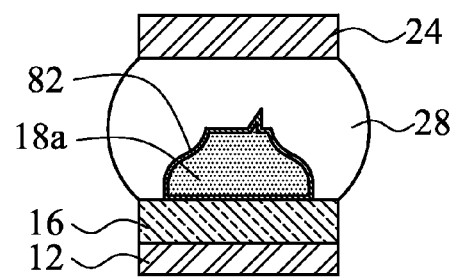
FIG. 31 is a joint with a single stud bulb and an IMC on the single stud bulb according to an embodiment.

FIG. 31 depicts the structure of FIG. 27, for example, except including an IMC 82 and without the bulb protection coating 20. The IMC 82 is formed on portions of the stud bulb 18a that the reflowed solder contacts during the reflow process. The IMC 82 can be formed by including a material in the solder 26 that reacts with the stud bulb 18a during the reflow process. The IMC 82 can be a copper tin (for example, $Cu_3Sn$ or $Cu_6Sn_5$) or the like.

In embodiments like that shown in FIG. 31, a bulb protection coating 20 may or may not be formed on the stud bulb 18a before reflowing the solder 26. If no bulb protection coating 20 is formed, the IMC 82 forms directly on the stud bulb 18a as discussed. If a bulb protection coating 20 is formed, in embodiments, the bulb protection coating 20 can dissolve during the reflowing, and the IMC 82 forms directly on the stud bulb 18a. Further, although not expressly depicted, embodiments contemplate a stud bulb 18a that has a bulb protection coating 20 on an outer surface of the stud bulb 18a, and the IMC 82 is formed on an outer surface of the bulb protection coating 20. In such a situation, the IMC 82 can be similarly formed as discussed with respect to FIG. 31.

Figure 32:
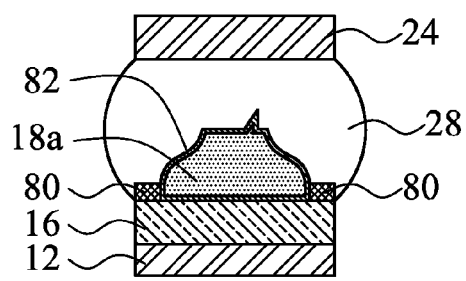
FIG. 32 is a joint with a single stud bulb and an IMC on a pad protection layer and the single stud bulb according to an embodiment.

FIG. 32 depicts the structure of FIG. 30, for example, except including an IMC 82 and without the bulb protection coating 20. The IMC 82 is formed on portions of the stud bulb 18a that the reflowed solder contacts during the reflow process. The IMC 82 can be a copper tin (for example, $Cu_3Sn$ or $Cu_6Sn_5$) or the like.

In embodiments like that shown in FIG. 32, a bulb protection coating 20 may or may not be formed on the stud bulb 18a before reflowing the solder 26. If no bulb protection coating 20 is formed, the IMC 82 forms directly on the stud bulb 18a as discussed. If a bulb protection coating 20 is formed, in embodiments, the bulb protection coating 20 can dissolve during the reflowing, and the IMC 82 forms directly on the stud bulb 18a. Further, although not expressly depicted, embodiments contemplate a stud bulb 18a that has a bulb protection coating 20 on an outer surface of the stud bulb 18a, and the IMC 82 is formed on an outer surface of the bulb protection coating 20. In such a situation, the IMC 82 can be similarly formed as discussed with respect to FIG. 32.

Figure 33:
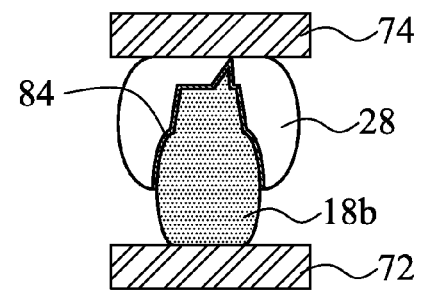
FIG. 33 is a partial joint with an IMC on a stud bulb according to an embodiment.

FIG. 33 depicts the structure of FIG. 29, for example, except including an IMC 84 and without the bulb protection coating 20. The IMC 84 is formed on portions of the stud bulb 18b that the reflowed solder contacts during the reflow process. As with the partial joint previously discussed, a portion of the stud bulb 18b is not covered by the IMC 84 or the reflowed solder connector 28. The IMC 84 can be formed by including a material in the solder 26 that reacts with the stud bulb 18b during the reflow process. The IMC 84 can be a copper tin (for example, $Cu_3Sn$ or $Cu_6Sn_5$) or the like.

In embodiments like that shown in FIG. 33, a bulb protection coating 20 may or may not be formed on the stud bulb 18b before reflowing the solder 26. If no bulb protection coating 20 is formed, the IMC 84 forms directly on the stud bulb 18b as discussed. If a bulb protection coating 20 is formed, in embodiments, the bulb protection coating 20 can dissolve during the reflowing, and the IMC 84 forms directly on the stud bulb 18b. Further, although not expressly depicted, embodiments contemplate a stud bulb 18b that has a bulb protection coating 20 on an outer surface of the stud bulb 18b and the IMC 84 on an outer surface of the bulb protection coating 20. In such a situation, the IMC 84 can be similarly formed as discussed with respect to FIG. 33.

Figure 34:
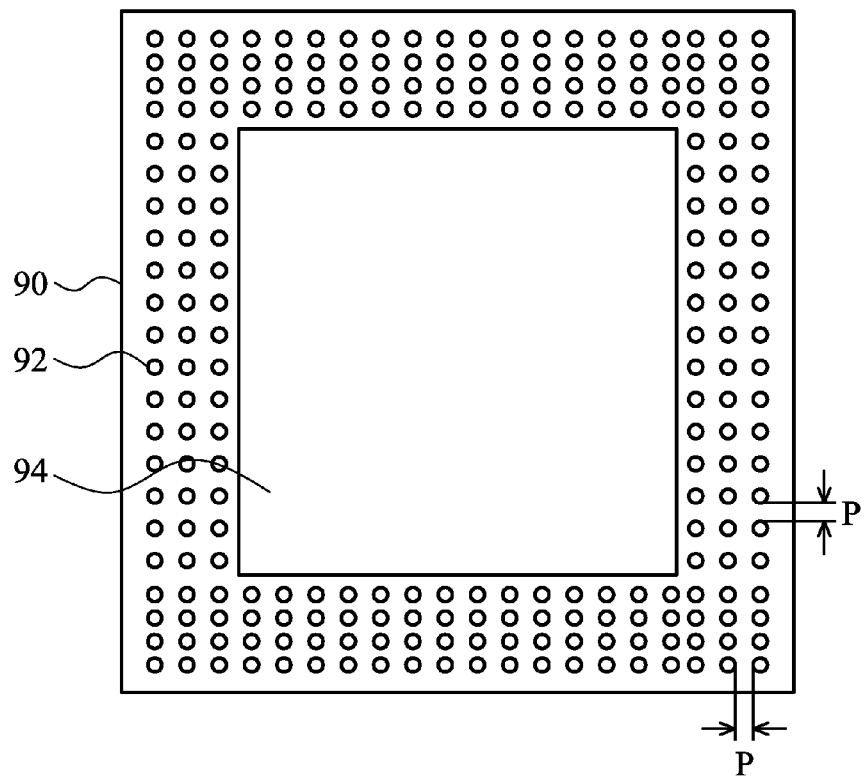
FIG. 34 is a layout view of components of a package structure according to an embodiment.
Figure 35:
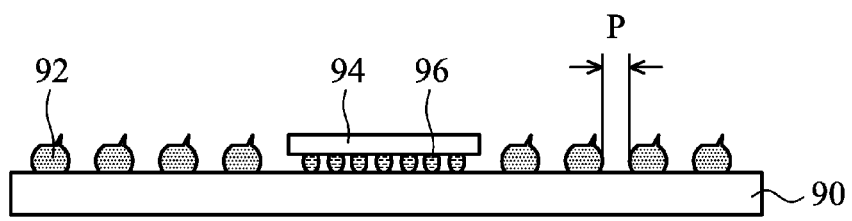
FIG. 35 is a cross section view of components of the package structure in FIG. 34 according to an embodiment.

FIGS. 34 and 35 depict a layout view and a cross section view, respectively, of components of a package structure. The structure includes a substrate 90 such as the first substrate 10 in above embodiments, stud bulbs 92 on a top surface of the substrate 90, and a die 94 attached on the top surface of the substrate 90. As shown in FIG. 35, electrical connectors 96 connect the die 94 to the substrate 90. The electrical connectors 96 can be, for example, microbumps, minibumps, C4 bumps, or the like. FIGS. 34 and 35 also illustrate a pitch P between the stud bulbs 92. The pitch is, for example, below 100 micrometers, or between approximately 50 micrometers and approximately 90 micrometers, such as approximately 80 micrometers. It should be noted that the structure can be a bottom substrate in a PoP structure and can have, for example, BGA balls on the bottom surface. Further, additional package structures can be over the top surface of the structure to form a PoP structure, such as shown in the embodiments in FIGS. 1 through 19.

Figure 36:
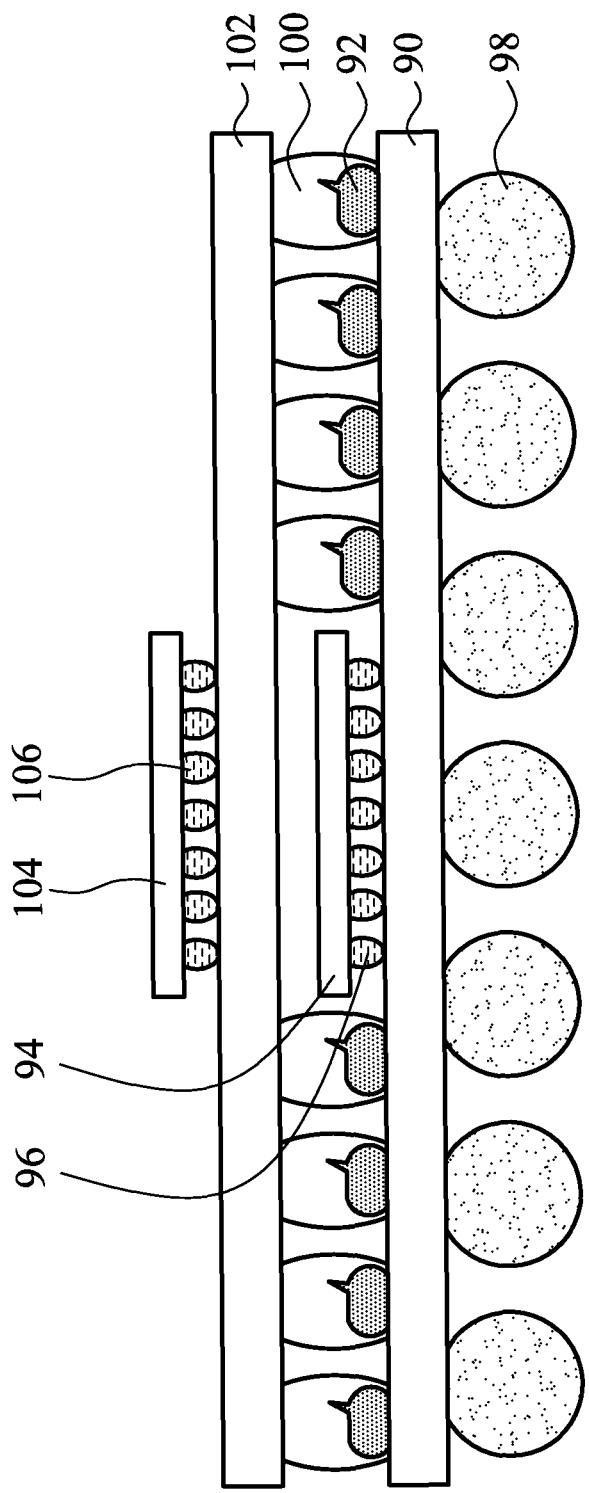
FIG. 36 is an example PoP structure according to an embodiment.

FIG. 36 illustrates an example PoP structure according to an embodiment. The structure in FIG. 36 includes components discussed with respect to FIGS. 34 and 35. The structure further includes electrical connectors 98, such as BGA balls, on a bottom surface of the substrate 90. Additionally, a second substrate 102 is attached to the substrate 90 by reflowed solder connectors 100, which are coupled to a bottom surface of the second substrate. The reflowed solder connectors 100 are reflowed around the stud bulbs 92 as discussed in previous embodiments. A second die 104 is attached to a top surface of the second substrate 102 by electrical connectors 106, which can be the same as or similar to the electrical connectors 96. Features of stud bulbs and other components previously discussed can be incorporated into the structure in FIG. 36. Further, additional dies can be on the structure, such as on bottom surfaces of the substrates 90 and 102 and/or on the top surfaces of the substrates 90 and 102. Even further, additional package structures can be on the top surface of the second substrate 102 which may or may not use stud bulbs or other features discussed herein.

Figure 37:
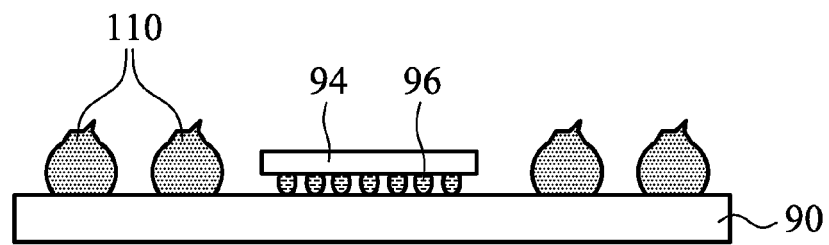
FIG. 37 is a cross section view of components of a package that includes stud bulbs having a height that extends above a top surface of a die according to an embodiment.

FIGS. 37 through 40 illustrate various package structures incorporating features previously discussed, which also may be used in the PoP structure of FIG. 36. FIGS. 37 through 40 include components of FIGS. 34 and 35, and as such, explicit discussion of those components is omitted with regard to FIGS. 37 through 40. In FIG. 37, the package includes stud bulbs 110 that have a height that extends above a top surface of the die 94. The stud bulbs 110 have a height, for example, between approximately 20 micrometers and approximately 80 micrometers, such as approximately 50 micrometers, and a diameter, for example, between approximately 10 micrometers and approximately 80 micrometers, such as approximately 30 micrometers.

Figure 38:
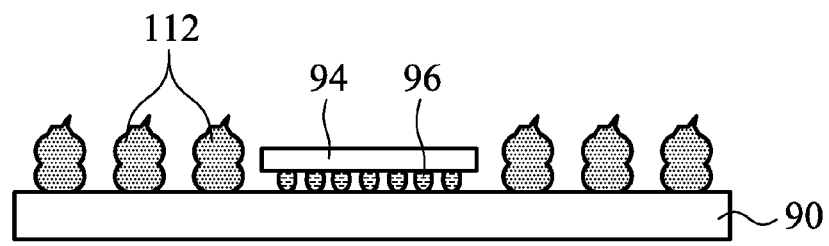
FIG. 38 is a cross section view of components of a package that includes stacked single stud bulbs having a height that extends above a top surface of a die according to an embodiment.

In FIG. 38, the package structure includes stacked stud bulbs 112 that each comprise two single stud bulbs. The stacked stud bulbs 112 have a height that extends above a top surface of the die 94. The stacked stud bulbs 112 have a height, for example, between approximately 30 micrometers and approximately 200 micrometers, such as approximately 150 micrometers, and a diameter, for example, between approximately 20 micrometers and approximately 150 micrometers, such as approximately 80 micrometers.

Figure 39:
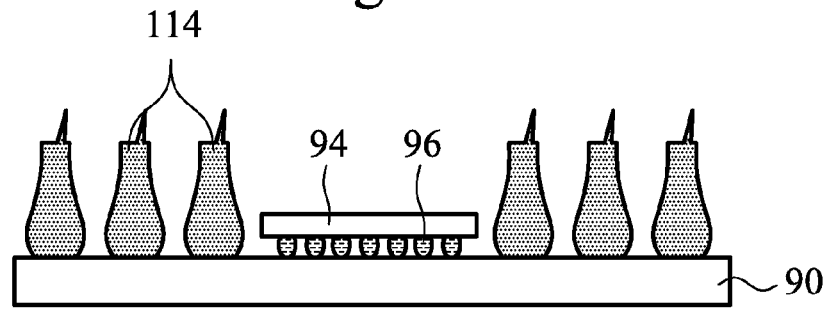
FIG. 39 is a cross section view of components of a package that includes stud bulbs with elongated tails having a height that extends above a top surface of a die according to an embodiment.

In FIG. 39, the package structure includes stud bulbs 114 with elongated tails. The stud bulbs 114 with elongated tails have a height that extends above a top surface of the die 94. The stud bulbs 114 with elongated tails have a height, for example, between approximately 30 micrometers and approximately 200 micrometers, such as approximately 150 micrometers, and a diameter, for example, between approximately 20 micrometers and approximately 150 micrometers, such as approximately 80 micrometers.

Figure 40:
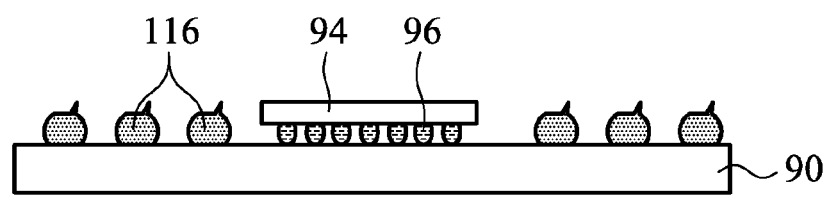
FIG. 40 is a cross section view of components of a package that includes stud bulbs having a height that does not extend above a top surface of a die according to an embodiment.

In FIG. 40, the package includes stud bulbs 116 that have a height that extends to a point that is below a top surface of the die 94. The stud bulbs 116 have a height, for example, between approximately 10 micrometers and approximately 50 micrometers, such as approximately 30 micrometers, and a diameter, for example, between approximately 5 micrometers and approximately 50 micrometers, such as approximately 30 micrometers. In an embodiment, in a process for forming the stud bulbs 116 includes reducing the height and/or diameter of the stud bulbs by, for example, laser drilling.

By having stud bulbs in a PoP structure, a pitch between connectors interconnecting the packages can be decreased, for example, below 100 micrometers, and thus, the density of the connectors can be increased. Further, in embodiments, the height and the pitch of the stud bulbs can be controlled by the selection of wires and/or by process parameter control. A process for creating the stud bulbs can be flexible and applied for various package sizes. Also, embodiments can use various materials that are compatible with conventional processes.

A first embodiment is a structure. The structure comprises a first substrate, stud bulbs, a die, a second substrate, and electrical connectors. The stud bulbs are coupled to a first surface of the first substrate. The die is attached to the first surface of the first substrate. The electrical connectors are coupled to the second substrate, and respective ones of the electrical connectors are coupled to respective ones of the stud bulbs.

Another embodiment is a structure. The structure comprises a first substrate, a second substrate, a stud bulb, and a solder connector. The first substrate comprises a first pad on a first surface of the first substrate, and a die is attached to the first surface of the first substrate. The second substrate comprises a second pad on a first surface of the second substrate. The stud bulb is on the first pad, and the solder connector couples the stud bulb to the second pad.

A further embodiment is a method. The method comprises providing a first substrate, a first pad being on a first surface of the first substrate, a die being attached to the first surface of the first substrate; forming a stud bulb on the first pad; providing a second substrate, a second pad being on a first surface of the second substrate; and coupling a solder connector to the stud bulb and to the second pad.

An even further embodiment is a structure. The structure comprises a first bond pad on a first surface of a first substrate, a die attached to the first surface of the first substrate, a second bond pad on a second surface of a second substrate, a stud bulb on the first bond pad, and solder mechanically coupling the stud bulb to the second bond pad. The first surface opposes the second surface, and the die is disposed between the first surface and the second surface.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a first substrate;
stud bulbs coupled to a first surface of the first substrate, the stud bulbs comprising a first material composition;
a die attached to the first surface of the first substrate;
a second substrate;
solder electrical connectors coupled to the second substrate, the solder electrical connectors comprising a second material composition, the second material composition being different from the first material composition, respective ones of the solder electrical connectors coupling respective ones of the stud bulbs; and
respective ones of protection coatings on a surface of the respective ones of the stud bulbs, the respective ones of the protection coatings being between the respective ones of the stud bulbs and the respective ones of the solder electrical connectors, the protection coatings comprising a third material composition, the third material composition being different from the first material composition and the second material composition.

2. The structure of claim 1, wherein the first substrate comprises pads, respective ones of pad protection layers being over respective ones of the pads, the respective ones of the stud bulbs being bonded to the respective ones of the pad protection layers.

3. The structure of claim 1, wherein the first substrate comprises pads, respective ones of the pads comprising respective ones of treated surfaces, the respective ones of the stud bulbs being bonded to respective ones of the treated surfaces.

4. The structure of claim 1, wherein the first substrate comprises pads, the respective ones of the stud bulbs being bonded directly to respective ones of the pads.

5. The structure of claim 1, wherein each of the stud bulbs comprises (i) a single stud bulb, (ii) a single stud bulb with an elongated tail, (iii) stacked at least two single stud bulbs, (iv) a first single stud bulb with an elongated tail stacked on a second single stud bulb, or (v) a combination thereof.

6. The structure of claim 1, wherein the respective ones of the stud bulbs and the respective ones of the solder electrical connectors form a partial joint.

7. A structure comprising:
a first substrate having a first pad on a first surface of the first substrate, a die being attached to the first surface of the first substrate;
a second substrate having a second pad on a first surface of the second substrate;
a stud bulb comprising a first material composition and on the first pad;
a protection coating comprising a second material composition and on a surface of the stud bulb, the second material composition being different from the first material composition; and
a solder connector comprising a third material composition and coupling the stud bulb to the second pad, the third material composition being different from the first material composition and the second material composition.

8. The structure of claim 7, wherein the first pad comprises a pad protection layer or a treated surface adjacent the stud bulb.

9. The structure of claim 7, wherein the stud bulb is directly bonded to the first pad by a metal-metal bond.

10. The structure of claim 7, wherein the stud bulb is a single stud bulb with an elongated tail.

11. The structure of claim 7, wherein the stud bulb comprises a first stud bulb stacked on a second stud bulb.

12. The structure of claim 11, wherein the first stud bulb is a single stud bulb with an elongated tail, and the second stud bulb is a single stud bulb.

13. The structure of claim 7, wherein the solder connector does not completely cover a surface of the stud bulb, the surface not being bonded to the pad.

14. A structure comprising:
a first bond pad on a first surface of a first substrate;
a die attached to the first surface of the first substrate;
a second bond pad on a second surface of a second substrate, the first surface opposing the second surface, the die being disposed between the first surface and the second surface;
a stud bulb comprising a first material composition and on the first bond pad;
a protection coating comprising a second material composition and on a surface of the stud bulb, the second material composition being different from the first material composition; and
solder comprising a third material composition and mechanically coupling the protection coating to the second bond pad, the third material composition being different from the first material composition and the second material composition.

15. The structure of claim 14, wherein the first bond pad (i) comprises a pad protection layer adjacent the stud bulb, (ii) comprises a treated surface adjacent the stud bulb, or (iii) is directly bonded to the stud bulb by a metal-metal bond.

16. The structure of claim 14, wherein the stud bulb comprises (i) a single stud bulb, (ii) a single stud bulb with an elongated tail, (iii) stacked at least two single stud bulbs, (iv) a first single stud bulb with an elongated tail stacked on a second single stud bulb, or (v) a combination thereof.

* * * * *